United States Patent
Hyland et al.

(10) Patent No.: US 7,493,193 B2
(45) Date of Patent: Feb. 17, 2009

(54) MONITORING AND REAL-TIME HEAT LOAD CONTROL BASED UPON SERVER AND ENVIRONMENTAL PARAMETERS

(75) Inventors: Robert Francis Hyland, Rochester, MN (US); Marvin Miles Misgen, Rochester, MN (US); Joseph Frank Prisco, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 11/197,602

(22) Filed: Aug. 4, 2005

(65) Prior Publication Data
US 2007/0032908 A1 Feb. 8, 2007

(51) Int. Cl.
G06F 19/00 (2006.01)
G06F 1/26 (2006.01)
G06F 11/34 (2006.01)

(52) U.S. Cl. ............... 700/275; 700/276; 700/278; 700/299

(58) Field of Classification Search ............ 700/275, 700/276, 278, 299
See application file for complete search history.

(56) References Cited

U.S. PATENT DOCUMENTS

| | | | |
|---|---|---|---|
| 4,183,224 A * | 1/1980 | Rule et al. ............ 62/91 |
| 4,750,545 A * | 6/1988 | Hile et al. ............ 165/226 |
| 5,230,466 A * | 7/1993 | Moriya et al. ............ 236/44 A |
| 5,261,596 A * | 11/1993 | Tachibana et al. ............ 236/49.3 |
| 5,493,808 A * | 2/1996 | Munday ............ 47/60 |
| 5,533,348 A * | 7/1996 | Baldwin et al. ............ 62/129 |
| 6,442,700 B1 * | 8/2002 | Cooper ............ 713/320 |
| 6,595,429 B1 * | 7/2003 | Carlson et al. ............ 236/44 R |
| 6,813,897 B1 * | 11/2004 | Bash et al. ............ 62/175 |
| 2005/0030171 A1 * | 2/2005 | Liu et al. ............ 340/500 |
| 2005/0182523 A1 * | 8/2005 | Nair ............ 700/276 |
| 2007/0236881 A1 * | 10/2007 | Harder et al. ............ 361/695 |
| 2007/0240437 A1 * | 10/2007 | Yonezawa et al. ............ 62/176.1 |

OTHER PUBLICATIONS

"How to design environmental controls for a server room", Klinder—Feb. 8, 2005. SearchWinComputing.com.*
"Thermal Management Solutions: Air Conditioners", Rittal Top Therm, date unknown.*

(Continued)

*Primary Examiner*—Michael D Masinick
(74) *Attorney, Agent, or Firm*—Joan Pennington (57) ABSTRACT

A method, apparatus and computer program product are provided for monitoring and real-time heat load control based upon server and environmental parameters. Multiple types of information technology equipment (ITE) and environmental data are monitored and collected. The collected data are analyzed, and displayed in a summary format. Heat load control rules are stored responsive to analyzing the collected data or a user selected control input. User selected and automated control functions are selectively provided responsive to analyzing the collected data and the stored heat load control rules.

14 Claims, 9 Drawing Sheets

OTHER PUBLICATIONS

"How and Why Mission-Critical Systems Differ from Common Air Conditioners", APC White Paper #56, Revision 2. 2003.*
"Emerging Cooling Requirements & Systems In Telecommunications Spaces", DB Baer, Liebert Corporation, USA. IEEE, Oct. 14-18, 2001. Intelec 2001.*
"Dynamic Management of Power Consumption", Simunic, HP Labs, Jan. 2002.*
"CPU Scheduling for Statistically-Asssured Real-Time Performance and Improved Energy Efficiency", Wu et al, ECE Dept, Va Tech, The Mitre Corporation, ISSS, Sep. 8-10, 2004.*
Emerson, "Built to a Higher Standard of Performance and Reliability", Liebert DS™, published Oct. 2004.
http://www.ee.polyu.edu.hk/staff/eencheun/WebSubject2/chapter9.htm, "Chapter 9. Computer Interface", Mar. 18, 2005, pp. 1-27.

* cited by examiner

300
FRONT VIEW TEMPERATURE GRADIENT

| Row | Col 1 | Col 2 | Col 3 |
|---|---|---|---|
| 42 | | | |
| 41 | 68.0 | 67.7 | 67.1 |
| 40 | | | |
| 39 | | | |
| 38 | | | |
| 37 | | | |
| 36 | | | |
| 35 | | | |
| 34 | | | |
| 33 | | | |
| 32 | | | |
| 31 | | | |
| 30 | 64.1 | 63.2 | 67.1 |
| 29 | | | |
| 28 | | | |
| 27 | | | |
| 26 | | | |
| 25 | 60.6 | 62.9 | 83.5 |
| 24 | | | |
| 23 | | | |
| 22 | | | |
| 21 | | | |
| 20 | 58.8 | 61.6 | 61.9 |
| 19 | | | |
| 18 | | | |
| 17 | | | |
| 16 | | | |
| 15 | | | |
| 14 | | | |
| 13 | | | |
| 12 | | | |
| 11 | | | |
| 10 | 58.7 | 59.8 | 59.5 |
| 9 | | | |
| 8 | | | |
| 7 | | | |
| 6 | | | |
| 5 | | | |
| 4 | | | |
| 3 | | | |
| 2 | | | |
| 1 | 59.7 | 59.3 | 59.4 |

H (arrow pointing to row 25, col 3: 83.5)

302
REAR VIEW TEMPERATURE GRADIENT

| Row | Col 1 | Col 2 | Col 3 |
|---|---|---|---|
| 42 | | | |
| 41 | | 89.1 | |
| 40 | | | |
| 39 | | | |
| 38 | | | |
| 37 | | | |
| 36 | | | |
| 35 | | | |
| 34 | | | |
| 33 | | | |
| 32 | | | |
| 31 | | | |
| 30 | | 74.3 | |
| 29 | | | |
| 28 | | | |
| 27 | | | |
| 26 | | | |
| 25 | | | |
| 24 | | | |
| 23 | | | |
| 22 | | | |
| 21 | | | |
| 20 | | 73.2 | |
| 19 | | | |
| 18 | | | |
| 17 | | | |
| 16 | | | |
| 15 | | | |
| 14 | | | |
| 13 | | | |
| 12 | | | |
| 11 | | | |
| 10 | | 79.7 | |
| 9 | | | |
| 8 | | | |
| 7 | | | |
| 6 | | | |
| 5 | | | |
| 4 | | | |
| 3 | | | |
| 2 | | | |
| 1 | | 81.8 | |

MONITORING AND REAL-TIME HEAT LOAD CONTROL BASED UPON SERVER AND ENVIRONMENTAL PARAMETERS

FIELD OF THE INVENTION

The present invention relates generally to the data processing field, and more particularly, relates to a method, apparatus and computer program product for monitoring and real-time heat load control based upon server and environmental parameters.

DESCRIPTION OF THE RELATED ART

Data center or computer room heat loads are increasing as high-density information technology equipment (ITE) is installed to meet customer's processing, application, and storage requirements.

Customers are using the latest installation planning best practices and modeling tools to manage the predicted ITE head load. After the ITE is installed, customers may follow-up to check server and environmental performance. Independent methods used to check performance may be to measure ITE heat load as well as monitor temperature and humidity.

Independent data collection results in fragmented data that is not only time consuming and difficult to overlay, but also does not give a complete picture of what is happening in the data center. Data center heat load management is a complex issue, but assembling the right pieces of data in a simple, easy to understand format to make informed decisions is critical and very much needed in the marketplace.

SUMMARY OF THE INVENTION

Principal aspects of the present invention are to provide a method, apparatus and computer program product for monitoring and real-time heat load control based upon server and environmental parameters. Other important aspects of the present invention are to provide such method, apparatus and computer program product for monitoring and real-time heat load control based upon server and environmental parameters substantially without negative effect and that overcome many of the disadvantages of prior art arrangements.

In brief, a method, apparatus and computer program product are provided for monitoring and real-time heat load control based upon server and environmental parameters. Multiple types of information technology equipment (ITE) and environmental data are monitored and collected. The collected data are analyzed, and displayed in a summary format. Heat load control rules are stored responsive to analyzing the collected data or a user selected control input. User selected and automated control functions are selectively provided responsive to analyzing the collected data and the stored heat load control rules.

In accordance with features of the invention, the monitored multiple types of information technology equipment (ITE) and environmental data includes one or more of ITE processor utilization, number of jobs, power consumption, environmental temperature and environmental humidity. The monitored and collected data also includes airflow variation, rate of change of temperature and humidity. User selected and automated control functions are provided to ensure operation of the ITE within a predefined specification. User selected and automated control functions include inlet temperature and fan speed control, and workload control for the ITE.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
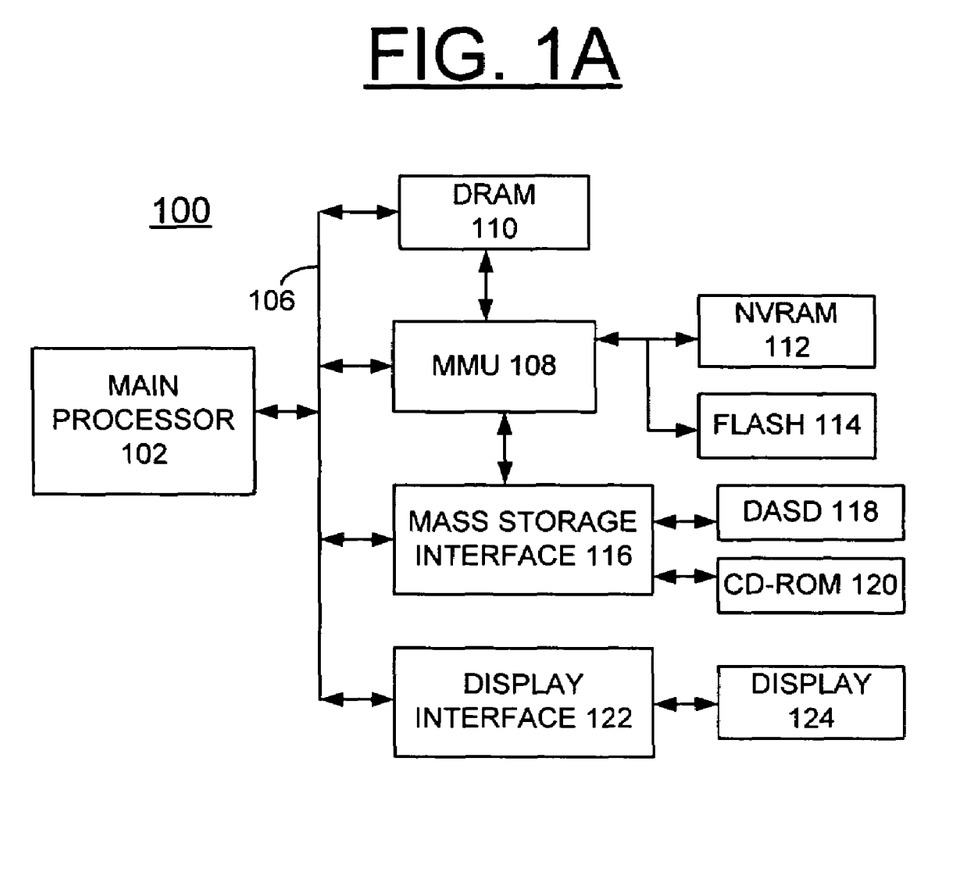
FIGS. 1A and 1B are block diagram representations illustrating an exemplary computer system and operating system for implementing methods for monitoring and real-time heat load control based upon server and environmental parameters in accordance with the preferred embodiment.
Figure 1B:
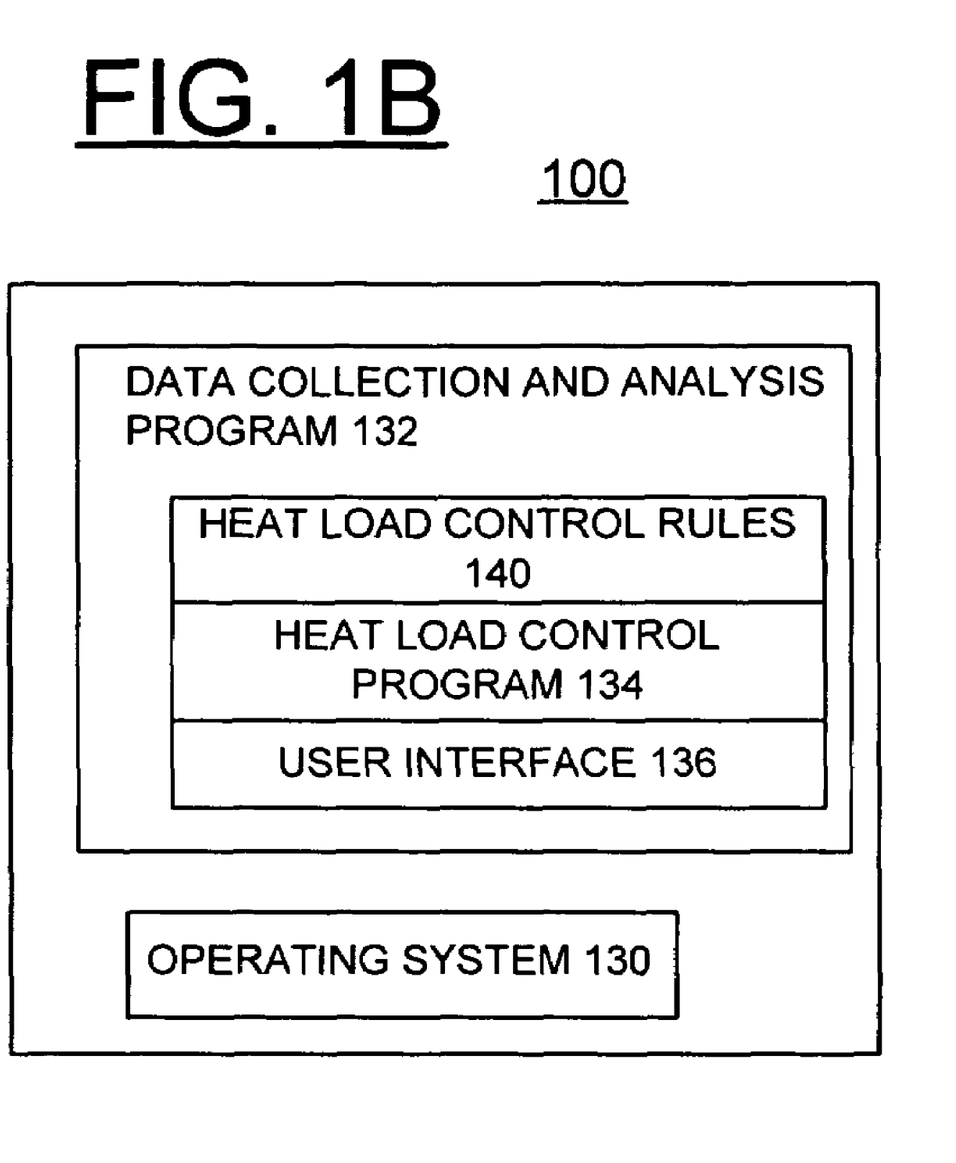

Having reference now to the drawings, in FIGS. 1A and 1B, there is shown an exemplary computer system generally designated by the reference character 100 for implementing methods for monitoring and real-time heat load control based upon server and environmental parameters in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 1B, computer system 100 includes an operating system 130, a data collection and analysis program 132, a heat load control program 134 of the preferred embodiment, and a user interface 136. Heat load control rules 140 are identified and stored in accordance with the control methods of the preferred embodiment.

Various commercially available computers can be used for computer system 100, for example, an IBM computer. CPU 102 is suitably programmed by the data collection and analysis program 132 and the heat load control program 134 to execute the flowchart of FIGS. 4 and 5 for implementing monitoring and real-time heat load control based upon server and environmental parameters in accordance with the preferred embodiment.

In accordance with features of the preferred embodiments, the invention allows for simultaneous data collection of multiple parameters, including actual ITE power consumption, ITE utilization, ITE jobs in progress, environment temperature, and environment humidity to provide the customer with a comprehensive view of ITE and environmental performance. The temperature and humidity are monitored, for example, at an ITE air inlet and temperature at an ITE air exhaust. The data allows automated control and allows the customer to make real-time decisions to improve reliability and uptime.

In accordance with features of the preferred embodiments, the invention is a method to collect and analyze real-time ITE and environmental data so that a heat load balance point can be attained and maintained in the data center. Besides facilitating the active management of ITE and environmental attributes in the data center, the invention enables the following:

1. To ensure operation within manufacturer specifications in all ITE operating modes. Manufacturers typically publish specifications for dry bulb temperature, wet bulb temperature, humidity, and dew point.

2. To review and control temperature and humidity up the front and the back of ITE in a rack. The purpose of this review is to look for exhaust air recirculation to the air inlet of the ITE via the sides or over the top of the rack.

3. To check and control fan speed. Fan speed has an impact on the amount of chilled air, measured in cubic feet per minute, that is required based upon a change in temperature through the ITE.

4. To review and control ITE workload. This review will guide the system manager to determine a workload that avoids over and under utilization of ITE system resources; thus, thermal cycling of the ITE.

5. To study the impact of loss of cooling on ITE. Customers with uninterruptible power supplies know how much battery run-time is available in the event of utility loss to shut-down ITE, but do not know how their ITE is affected during this time if cooling is either unavailable for a few minutes or not available at all.

In accordance with features of the preferred embodiments, the invention compiles multiple types of ITE data as well as environmental data and outputs a comprehensive report with views that can be easily understood for decision making by data center personnel. The parameters that are compiled in a report are ITE measured power consumption, ITE processor utilization percentage, ITE fan speed, number of jobs running in the ITE operating system, and temperature as well as humidity data from the ITE air inlet and exhaust.

Figure 2:
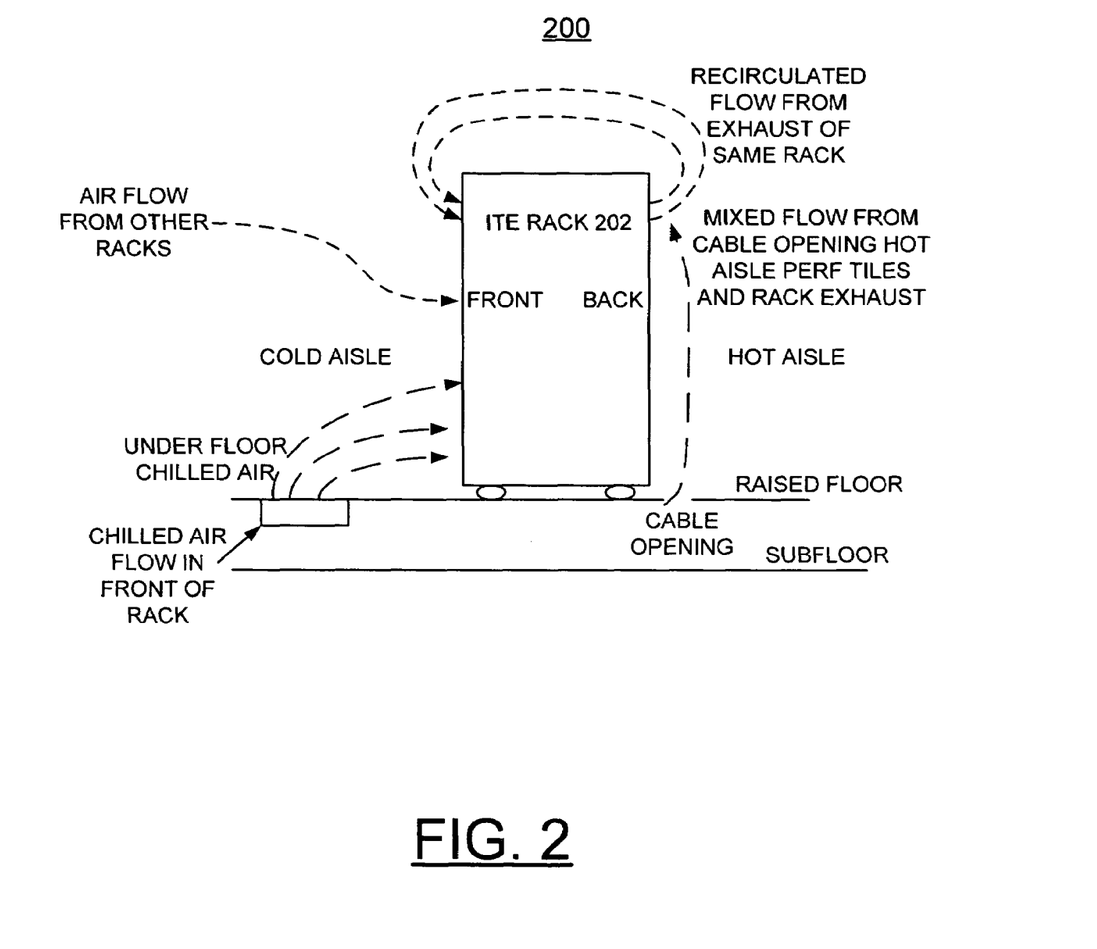
FIG. 2 is a block diagram representation illustrating an exemplary information technology equipment (ITE) monitoring and control environment in accordance with the preferred embodiment.

Referring to FIG. 2, there is shown an exemplary information technology equipment (ITE) monitoring and control environment generally designated by the reference character 200 in accordance with the preferred embodiment. ITE monitoring and control environment 200 provides one example of recirculation of exhaust air over the top of a rack 202. As shown in the exemplary ITE monitoring and control environment 200, a chilled airflow provides airflow labeled under floor chilled air from a cold aisle to the front of the rack 202 that sits on a raised floor. Also airflow from other racks is shown to the front of the rack 202. At a hot aisle at the back or rear of the rack 202, a mixed flow is shown from a cable opening, hot aisle perforated tiles, and rack exhaust.

Data necessary to provide comprehensive reports of ITE and the environment are not available from a single-source, but are integrated and assembled via by the data collection and analysis program 132 and then used by the heat load control program 134. While the ITE has the ability to monitor processor utilization, jobs, and fan speed, it must be logged at regular intervals in a format that is consistent with other data that is collected. The power consumption, temperature, and humidity data are collected. Coordination between all the input is necessary and is provided by the data collection and analysis program 132 so that the output is formatted and easily interpreted to make important decisions about the operational health of a data center, such as within rack 202 of the ITE monitoring and control environment 200.

Figure 3:
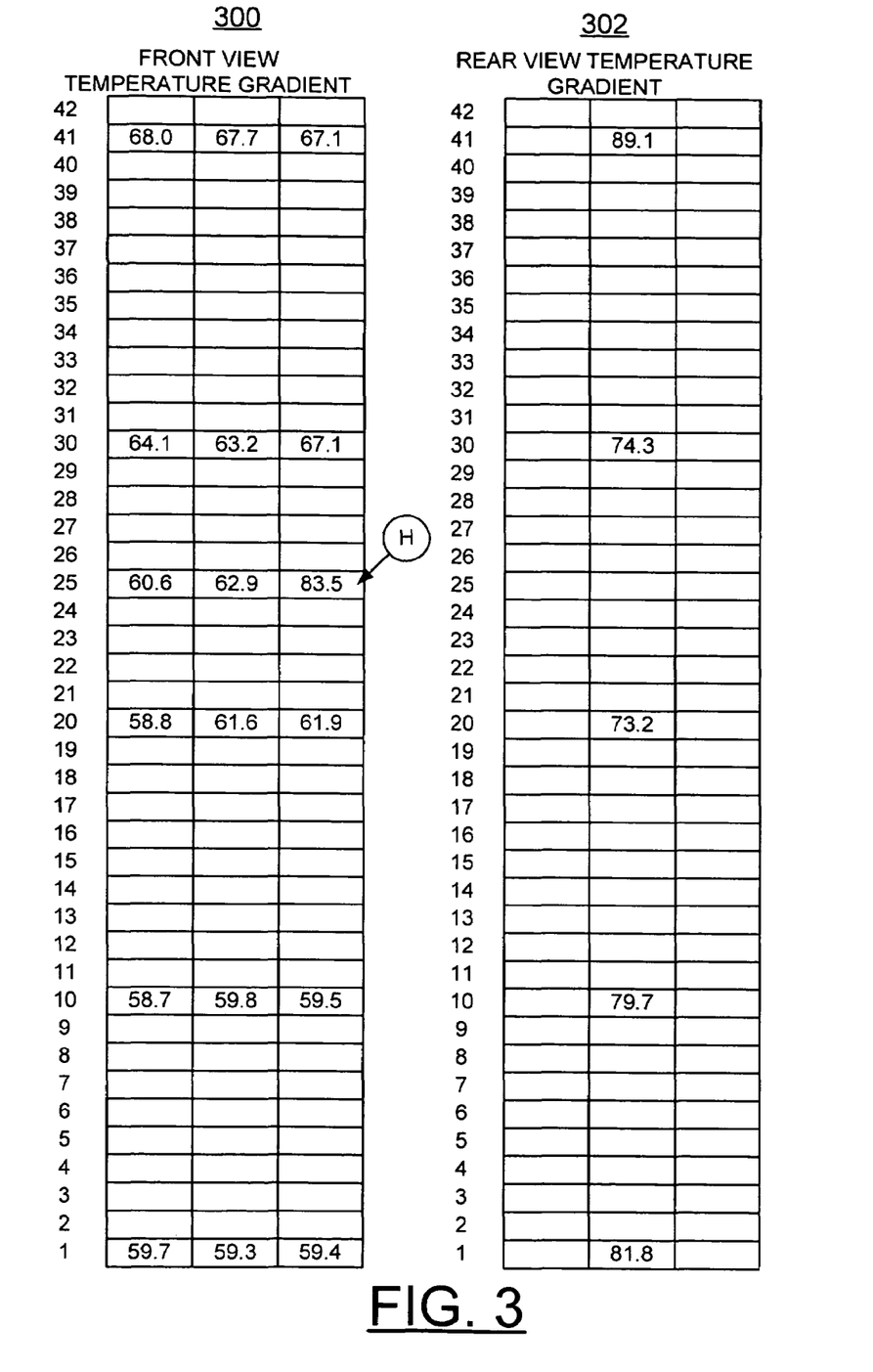
FIG. 3 illustrates exemplary temperature measurements up and across front and rear rack faces of the information technology equipment (ITE) of FIG. 2 in accordance with the preferred embodiment.

FIG. 3 illustrates exemplary temperature measurements up and across front and rear rack faces of the information technology equipment (ITE) generally designated by the reference character 300, 302 in accordance with the preferred embodiment. As shown in FIG. 3, the front exemplary temperature measurements 300 vary up and across the front face and are substantially less that the rear exemplary temperature measurements 302. A hot spot labeled H in the front exemplary temperature measurements 300 indicates, for example, discharge flow from a switch through the front face. The results of the illustrated exemplary measurements serve several purposes. The first, as shown in FIG. 2, is to identify recirculation of exhaust air within the rack, for example, when filler or blanking panels are not used. The second is to identify recirculation of exhaust or preheated air that may come around the sides of a rack. The third is to identify recirculation of exhaust air that may come over the top of the rack, for example, as illustrated in FIG. 2. The measurements can be used for further analysis and control of the ITE. Recirculation is significant to ITE as high temperatures threaten reliability and availability.

Figure 4:
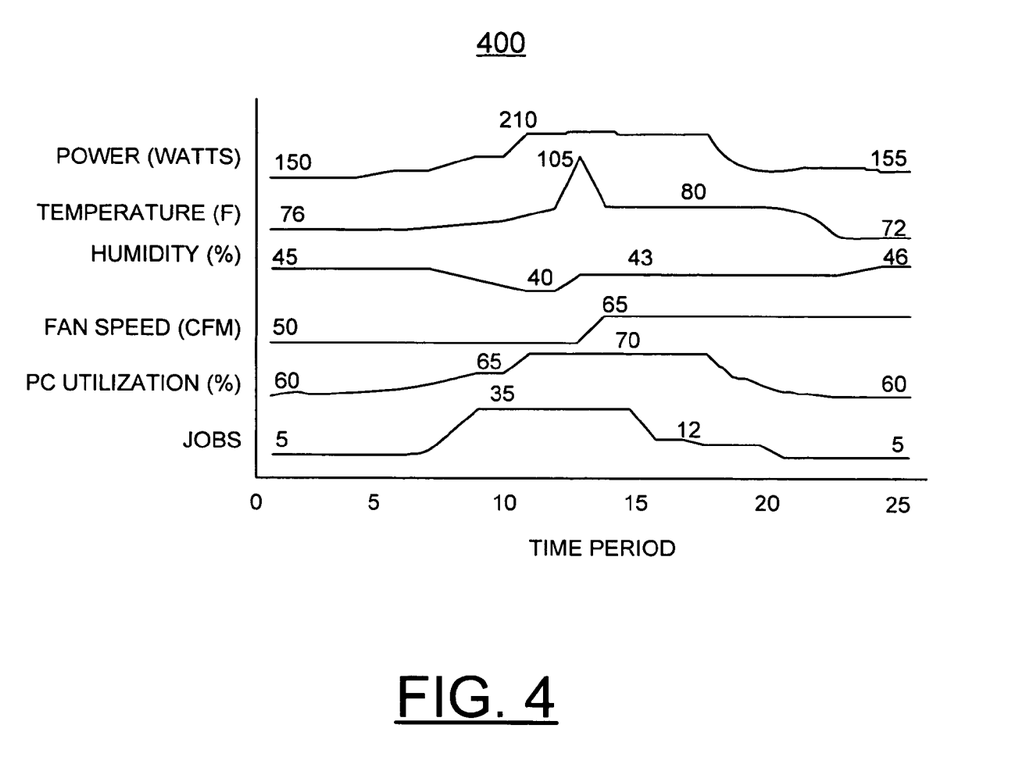
FIG. 4 is a chart illustrating an exemplary monitoring and control summary report for information technology equipment (ITE) in accordance with the preferred embodiment.

FIG. 4 is a chart illustrating an exemplary monitoring and control summary report for information technology equipment (ITE) generally designated by the reference character 400 in accordance with the preferred embodiment. The sample of an ITE and Environment Summary Report Strip Chart 400 includes a plurality of types of ITE and environmental data including Power in Watts, Temperature in degrees Fahrenheit, Humidity in %, Fan Speed in cubic feet per minute (CFM), Processor Utilization in %, and Jobs in a number value, shown from the chart top to chart bottom. The sample of an ITE and Environment Summary Report Strip Chart 400 provides a small snapshot in time that shows an increased number of batch jobs that run in the early hours of the morning. As the number of jobs increase, which increases processor utilization, the power consumption rises to the point where the air inlet temperature is out of the manufacturer's specification for a short duration. In response to the temperature rise, the equipment fans change speed to bring more chilled air into the equipment; thus, reducing the temperature measured at the air inlet.

Because the air inlet temperature rises to a very high level that could have an impact of reliability and uptime, several actions could be taken, including:

An automated or manual workload balance to keep processor utilization at a more constant level.

Supply more chilled air to the equipment via perforated tiles. The standard perforated tile is 25% open and allows up to 700 CFM at 0.01" water-column pressure. There are perforated grates that are as much as 60% open that would supply more CFM to the equipment and keep the temperature within specification at operating extremes.

Change the set points of the Computer Room Air Conditioning (CRAC) units. There are several settings that can be changed, such as the supply and return air temperature, the humidification point, and the chilled water temperature.

Review cable openings and other unnecessary openings in the raised-floor. Typically, these openings do not provide the equipment air inlets with chilled air, rather, reduce the CFM available per perforated tile.

The report provides a recommended set of corrective measures, while the customer further can experiment to ultimately fix heat load balance deficiencies. A subset of the data collected can be presented in a psychrometric chart view as illustrated in FIG. 5 and temperature gradient views as illustrated in FIG. 3 to aid in identifying a solution.

Figure 5:
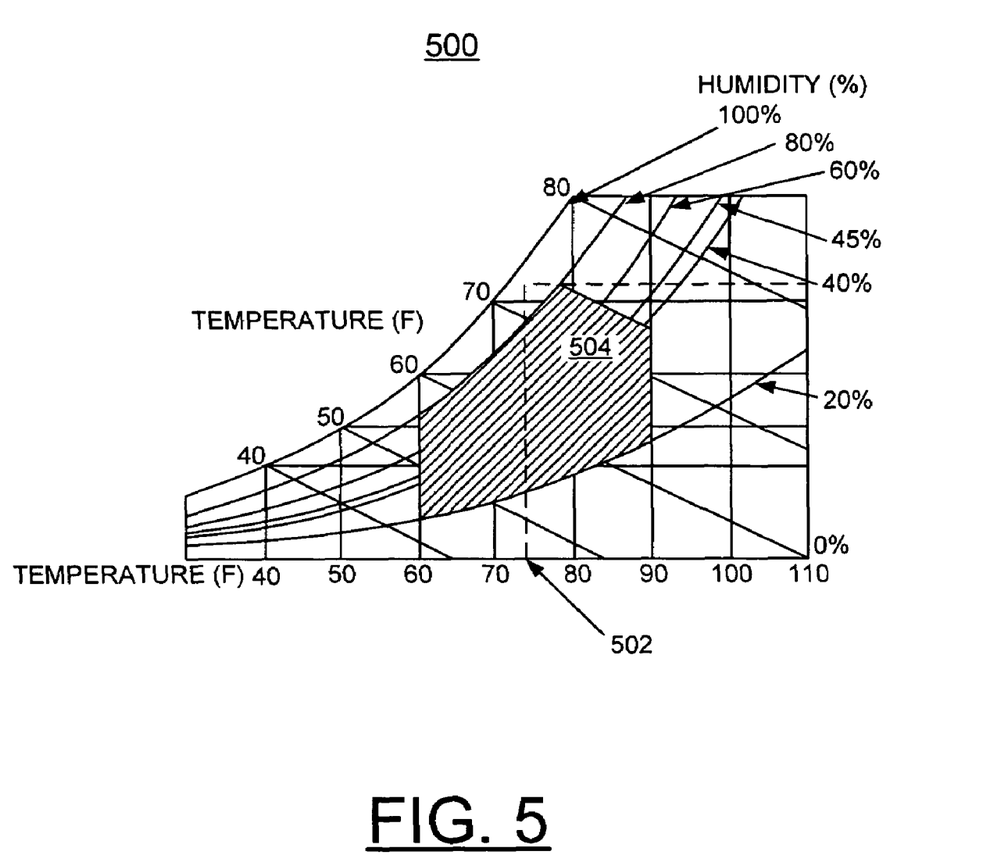
FIG. 5 is a chart illustrating another exemplary monitoring and control summary report for information technology equipment (ITE) in accordance with the preferred embodiment.

FIG. 5 shows an example of recorded temperature and humidity data points generally designated by the reference character 500 for each time interval during the data collection period of FIG. 4. A design criteria temperature is indicated by a dotted line labeled 502. All data points within the region 504 are within specification; however, substantial deviations from the recommended operating point in either direction, if maintained for long periods, will expose the equipment to malfunction from external conditions. For example, high relative humidity levels might cause improper feeding of paper, operator discomfort, and condensation on windows and walls when outside temperatures fall below room dew point. The data points are used for further analysis and control.

Figure 6:
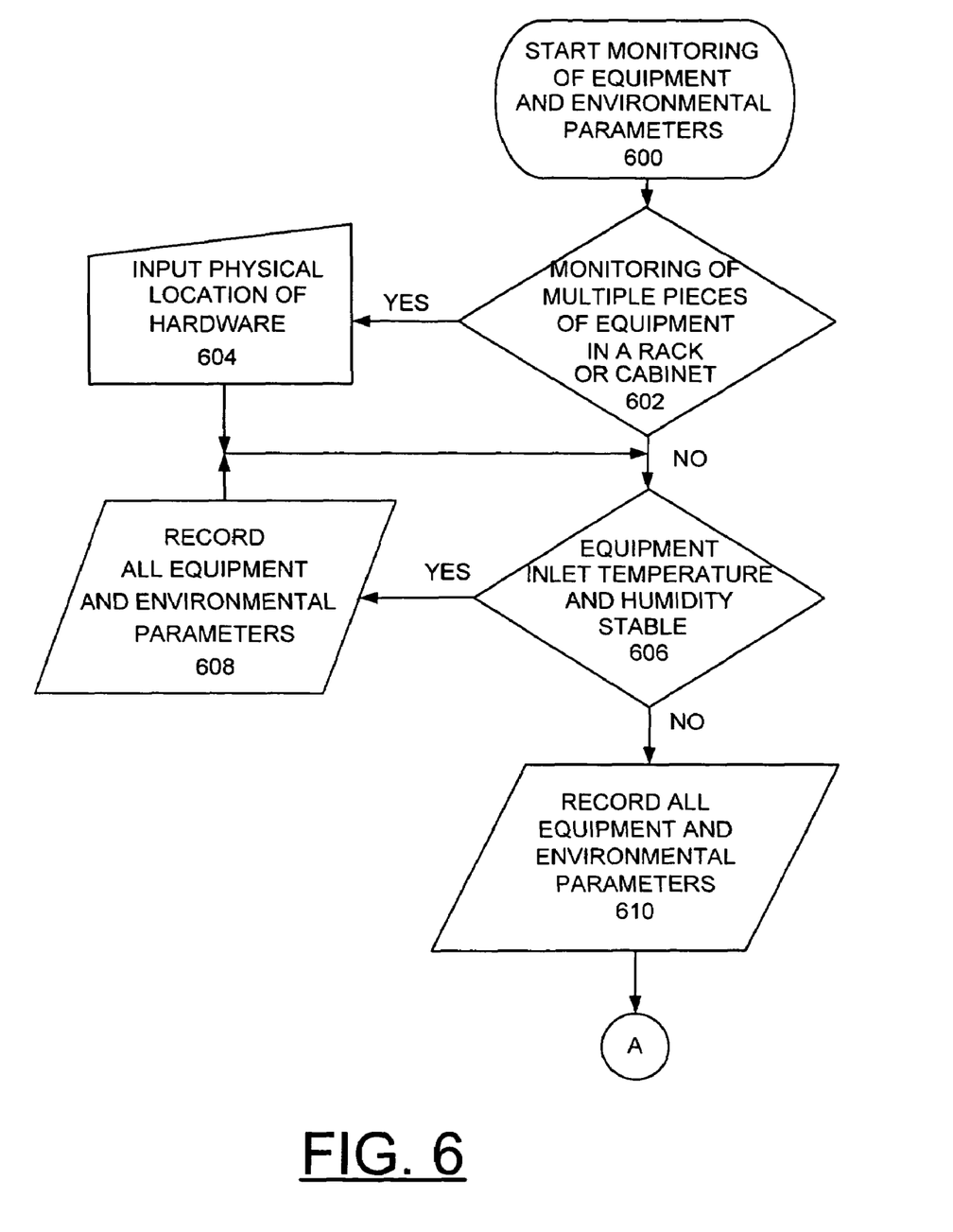
FIGS. 6 and 7 are flow charts illustrating exemplary steps for monitoring and real-time heat load control based upon server and environmental parameters in accordance with the preferred embodiment.
Figure 7:
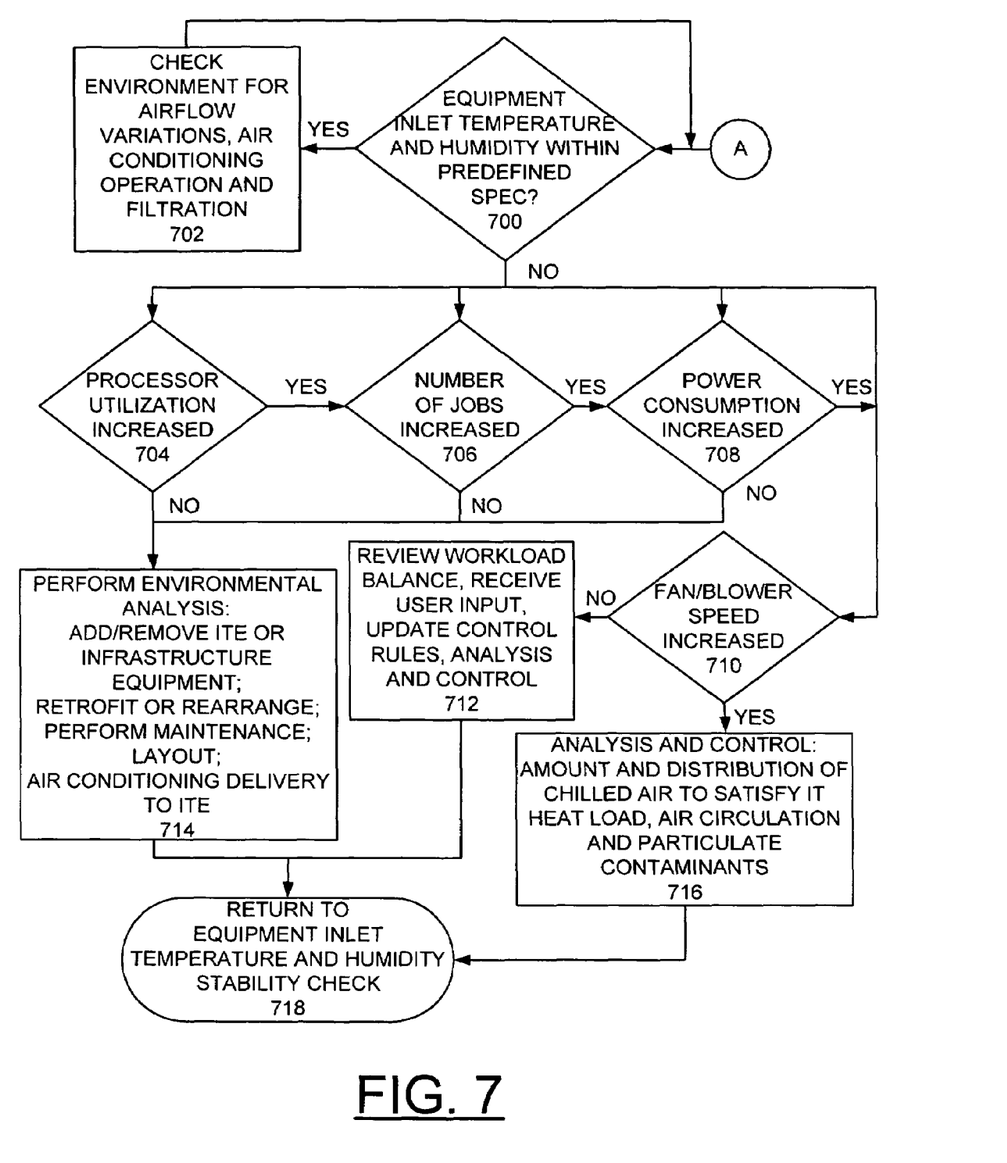

FIGS. 6 and 7 are flow charts illustrating exemplary steps for monitoring and real-time heat load control based upon server and environmental parameters in accordance with the preferred embodiment.

Referring now to FIG. 6, first monitoring of equipment and environmental parameters starts as indicated in a block 600. Checking is performed to identify monitoring of multiple pieces of equipment in a rack or cabinet as indicated in a decision block 602. When monitoring of multiple pieces of equipment in a rack or cabinet is identified, then the physical location of hardware is input as indicated in a block 604. Next checking whether inlet temperature and humidity are stable is performed as indicated in a decision block 606. When the inlet temperature and humidity are stable, then all equipment and environmental parameters are recorded as indicated in a block 608. Then checking whether inlet temperature and humidity are stable is again performed at decision block 606. When the inlet temperature and humidity are not stable, then all equipment and environmental parameters are recorded as indicated in a block 610. Then the sequential steps continue following entry point A in FIG. 7.

Referring to FIG. 7 following entry point A, checking whether equipment inlet temperature and humidity are within a predefined specification is performed as indicated in a decision block 700. For example, the predefined specification can be defined generally according to ASHRAE, 2004, Special Publication, Thermal Guidelines for Data Processing Environments, by American Society of Heating, Refrigerating and Air-Conditioning Engineers, Inc., Atlanta, Ga. When the equipment inlet temperature and humidity are within a predefined specification, then the. environment is checked for airflow variations, air conditioning operation and filtration as indicated in a block 702.

When the equipment inlet temperature and humidity are not within a predefined specification, then checking whether processor utilization has increased is performed as indicated in a decision block 704. When the processor utilization has increased, then checking whether the number of jobs has increased is performed as indicated in a decision block 706. When the number of jobs has increased, then checking whether power consumption has increased is performed as indicated in a decision block 708. When the power consumption has increased, then checking whether fan or blower speed has increased is performed as indicated in a decision block 710.

When the fan or blower speed has not increased, then workload balance is reviewed, user input is received and control rules are updated responsive to the review of the workload balance and the user inputs, and analysis and control are provided as indicated in a block 712. Then workload balance is reviewed, for example, including monitoring of summary chart data, such as illustrated in FIGS. 4 and 5. Otherwise when the processor utilization, the number of jobs, or power consumption has not increased, then environmental analysis is performed as indicated in a block 714, for example, to add or remove ITE or infrastructure equipment; retrofit or rearrange; perform maintenance; or layout for air conditioning delivery to the ITE.

When the fan or blower speed has increased, then analysis and control are provided as indicated in a block 716, for example, to identify and control the amount and distribution of chilled air to satisfy the ITE head load, air circulation and particulate contaminants. Then after the analysis and control at block 712, 714, or 716, then the exemplary steps return to equipment inlet temperature and humidity stability check as indicated in a block 718.

Figure 8:
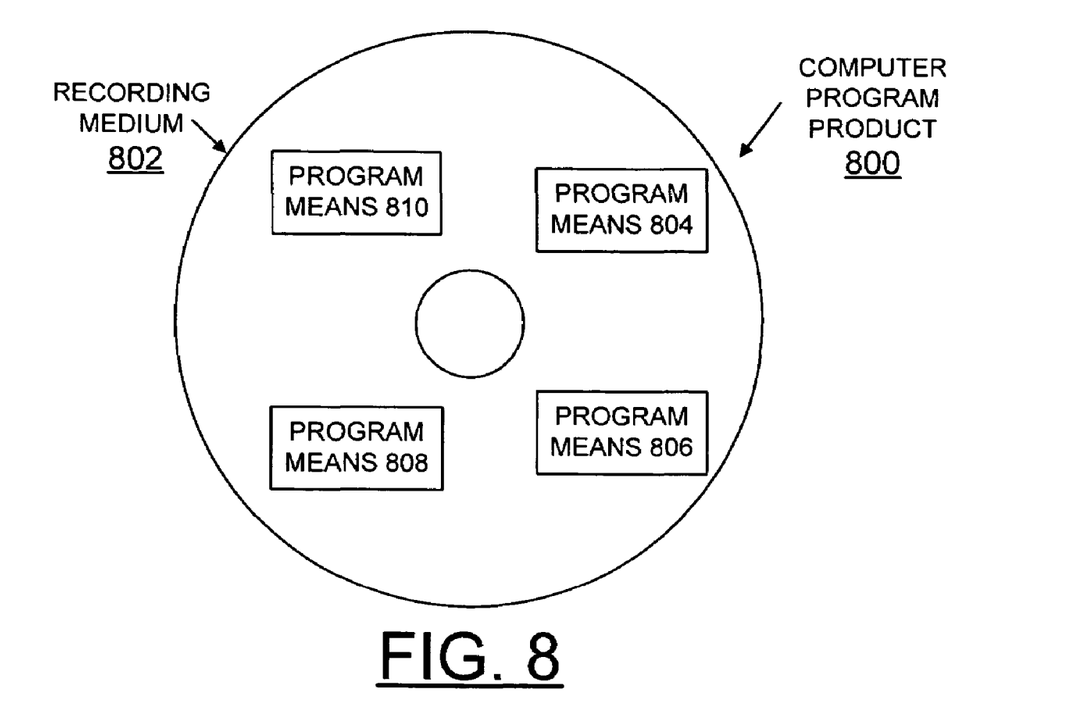
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, a transmission type media such as a digital or analog communications link, or a similar computer program product. Recording medium 802 stores program means 804, 806, 808, 810 on the medium 802 for carrying out the methods for monitoring and real-time heat load control based upon server and environmental parameters of the preferred embodiment in the system 100 of FIG. 1.

A sequence of program instructions or a logical assembly of one or more interrelated modules defined by the recorded program means 804, 806, 808, 810, direct the computer system 100 for monitoring and real-time heat load control based upon server and environmental parameters of the preferred embodiment.

While the present invention has been described with reference to the details of the embodiments of the invention shown in the drawing, these details are not intended to limit the scope of the invention as claimed in the appended claims.

What is claimed is:

1. A method for monitoring and real-time heat load control of a data center, including rack mounted information technology equipment (ITE), comprising the steps of:

monitoring and collecting multiple types of both information technology equipment (ITE) operating mode data, and environmental data; said monitored and collected information technology equipment (ITE) operating mode data including ITE processor utilization, ITE number of jobs, and ITE power consumption;

analyzing and displaying said monitored and collected data in a predefined format;

receiving a user selected control input;

storing heat load control rules responsive to analyzing said monitored and collected information technology equipment (ITE) operating mode data, and environmental data and said user selected control input;

selectively providing user selected and automated control functions responsive to said heat load control rules.

2. A method for monitoring and real-time heat load control as recited in claim 1 wherein said multiple types of environmental monitored and collected data includes airflow variation, rate of change of temperature and humidity.

3. A method for monitoring and real-time heat load control as recited in claim 1 wherein said multiple types of environmental monitored and collected data includes temperature at an ITE air inlet and temperature at an ITE air exhaust.

4. A method for monitoring and real-time heat load control as recited in claim 1 wherein said multiple types of environmental monitored and collected data includes humidity at an ITE air inlet and humidity at an ITE air exhaust.

5. A method for monitoring and real-time heat load control as recited in claim 1 wherein said user selected and automated control functions are provided to ensure operation of the ITE within a predefined specification.

6. A method for monitoring and real-time heat load control as recited in claim 1 wherein said user selected and automated control functions include inlet temperature and fan speed control.

7. A method for monitoring and real-time heat load control as recited in claim 1 wherein said user selected and automated control functions include workload control for the ITE.

8. A computer program product stored on a computer readable storage medium for monitoring and real-time heat load control in a computer system of a data center, including rack mounted information technology equipment (ITE), said computer readable storage medium storing instructions, and when said instructions are executed by the computer system cause the computer system to perform the steps of:

monitoring and collecting multiple types of both information technology equipment (ITE) operating mode data, and environmental data; said monitored and collected information technology equipment (ITE) operating mode data including ITE processor utilization, ITE number of jobs, and ITE power consumption;

analyzing and displaying said monitored and collected data in a predefined format;

receiving a user selected control input;

storing heat load control rules responsive to analyzing said monitored and collected information technology equipment (ITE) operating mode data, and environmental data and said user selected control input;

selectively providing user selected and automated control functions responsive to said heat load control rules.

9. A computer program product for monitoring and real-time heat load control as recited in claim 8 wherein said multiple types of environmental monitored and collected data includes airflow variation, rate of change of temperature and humidity.

10. A computer program product for monitoring and real-time heat load control as recited in claim 8 wherein said multiple types of environmental monitored and collected data includes temperature at an ITE air inlet, temperature at an ITE air exhaust, humidity at an ITE air inlet, and humidity at an ITE air exhaust.

11. A computer program product for monitoring and real-time heat load control as recited in claim 8 wherein said user selected and automated control functions are provided to ensure operation of the ITE within a predefined specification.

12. A computer program product for monitoring and real-time heat load control as recited in claim 8 wherein said user selected and automated control functions include inlet temperature and fan speed control.

13. A computer program product for monitoring and real-time heat load control as recited in claim 8 wherein said user selected and automated control functions include workload control for the ITE.

14. Apparatus for monitoring and real-time head load control in a computer system of a data center, including rack mounted information technology equipment (ITE), comprising:

a data collection and analysis program stored on a computer readable storage medium; said computer readable storage medium storing instructions, a heat load control program stored on a computer readable storage medium; said computer readable storage medium storing instructions, said instructions of said data collection and analysis program being executed by the computer system for monitoring and collecting multiple types both information technology equipment (ITE) operating mode data, and environmental data; said monitored and collected information technology equipment (ITE) operating mode data including ITE processor utilization, ITE number of jobs, and ITE power consumption;

said instructions of said data collection and analysis program being executed by the computer system for analyzing and displaying said monitored and collected data in a predefined format;

a user interface coupled to said data collection and analysis program and said heat load control program; said user interface for receiving a user selected control input;

said instructions of said heat load control program being executed by the computer system for storing heat load control rules responsive to analyzing said monitored and collected information technology equipment (ITE) operating mode data, and environmental data and said user selected control input;

said heat load control program being executed by the computer system for selectively providing user selected and automated control functions responsive to said heat load control rules.

\* \* \* \* \*